United States Patent [19]
Kouchi et al.

[11] Patent Number: 5,886,365
[45] Date of Patent: *Mar. 23, 1999

[54] LIQUID CRYSTAL DISPLAY DEVICE HAVING A CAPACITATOR IN THE PERIPHERAL DRIVING CIRCUIT

[75] Inventors: Tetsunobu Kouchi, Hiratsuka; Mamoru Miyawaki, Isehara; Shunsuke Inoue, Yokohama; Takanori Watanabe, Atsugi, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 490,300

[22] Filed: Jun. 14, 1995

[30] Foreign Application Priority Data

Jun. 20, 1994 [JP] Japan .................................. 6-137323
May 12, 1995 [JP] Japan .................................. 7-114565

[51] Int. Cl.[6] .................................................. H01L 33/00
[52] U.S. Cl. .............................. 257/59; 257/72; 257/82; 257/89; 349/37; 349/38; 349/151; 349/152
[58] Field of Search ...................... 359/59, 88; 345/90, 345/91, 92, 93; 257/59, 72, 82, 89, 51, 296–297; 349/37, 38, 151, 152, 35, 54, 113, 115

[56] References Cited

U.S. PATENT DOCUMENTS

| | | |
|---|---|---|
| 4,923,285 | 5/1990 | Ogino et al. ............................ 349/37 |
| 5,036,317 | 7/1991 | Buzak ...................................... 349/31 |
| 5,317,433 | 5/1994 | Miyawaki et al. ....................... 359/59 |
| 5,386,135 | 1/1995 | Nakazato ............................... 257/296 |
| 5,434,433 | 7/1995 | Takasu et al. ........................... 359/59 |
| 5,532,854 | 7/1996 | Fergason ................................. 359/84 |

*Primary Examiner*—Tom Thomas
*Assistant Examiner*—Fetsum Abraham
*Attorney, Agent, or Firm*—Fitzpatrick, Cella, Harper & Scinto

[57] ABSTRACT

A small-size and large-capacitance capacitor is provided for the peripheral driving circuit of a liquid crystal display device. A capacitor exhibiting crystalline property is provided on a monocrystalline silicon in the peripheral driving circuit of a liquid crystal display device using an insulator film deposition process used to manufacture TFTs (thin-film transistors) of a display pixel portion and the peripheral driving circuit. The capacitor, using monocrystalline silicon as electrodes and an insulator on the monocrsytalline silicon as a dielectric, has a small size and a large capacitance as compared with a capacitor manufactured on amorphous silicon or monocrytalline silicon, and is thus capable of high quality display.

10 Claims, 20 Drawing Sheets

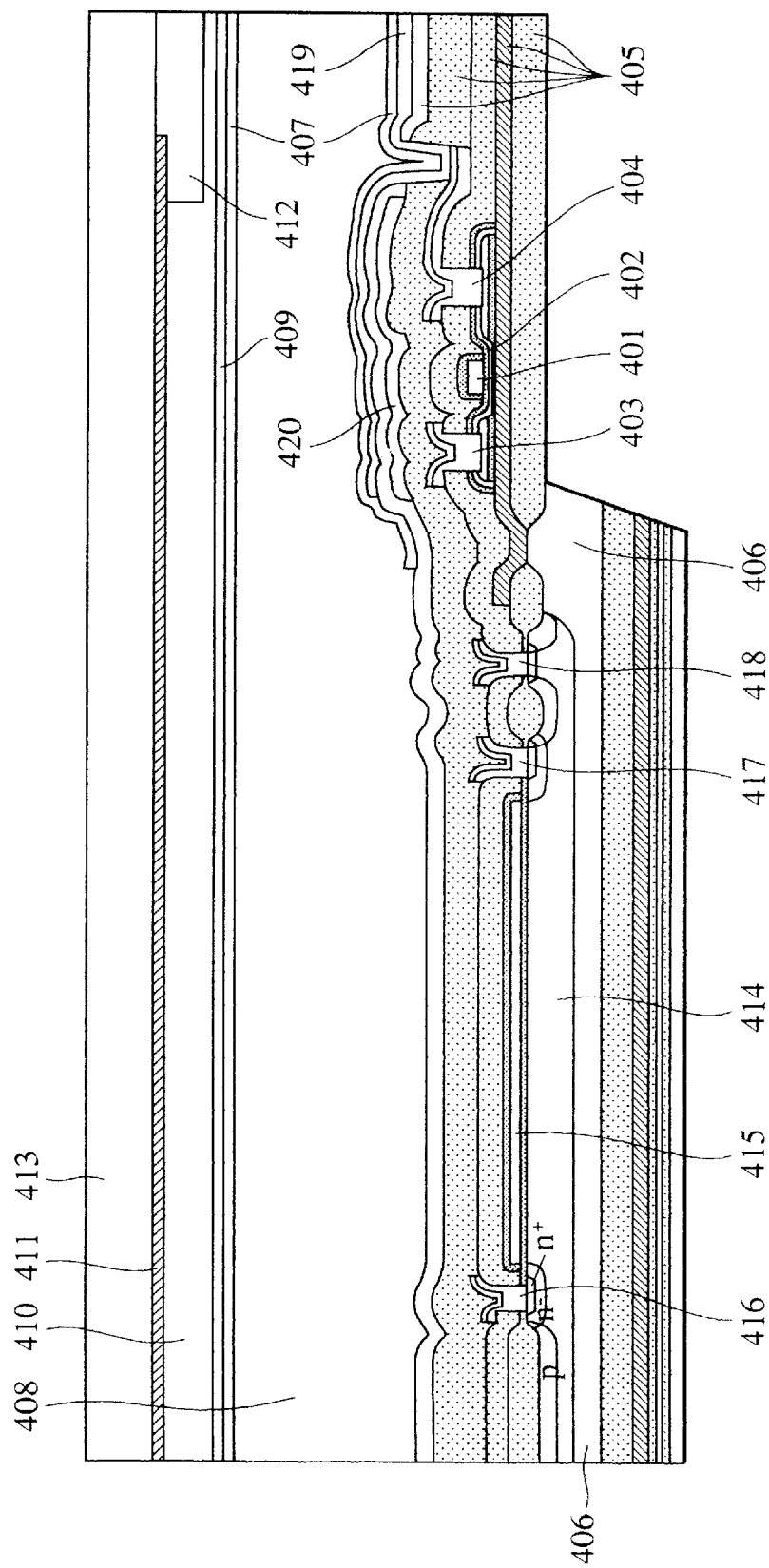

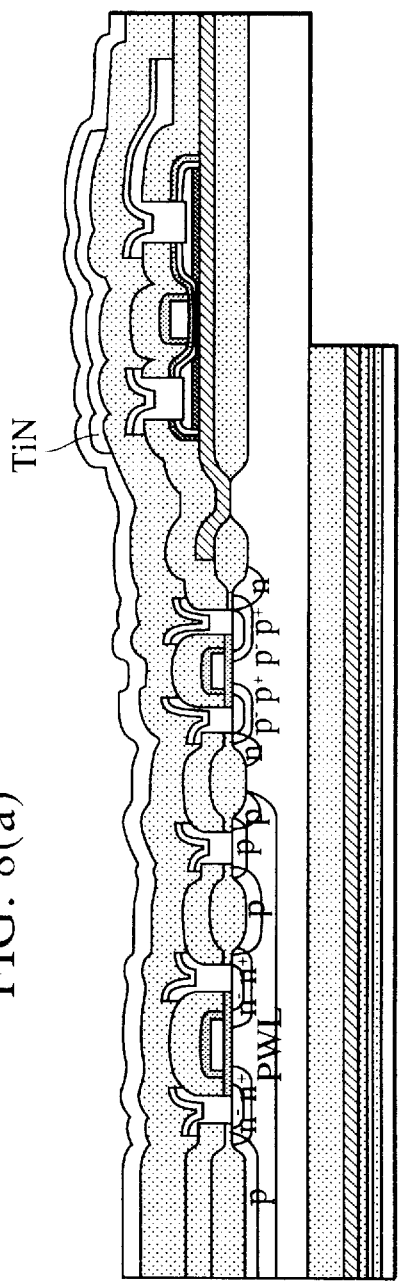
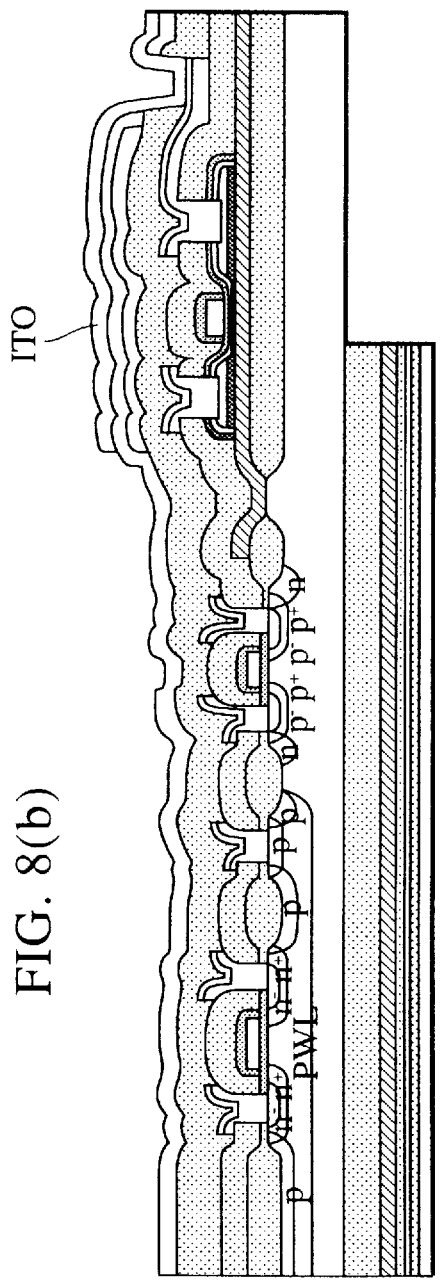
FIG. 8(a)
FIG. 8(b)

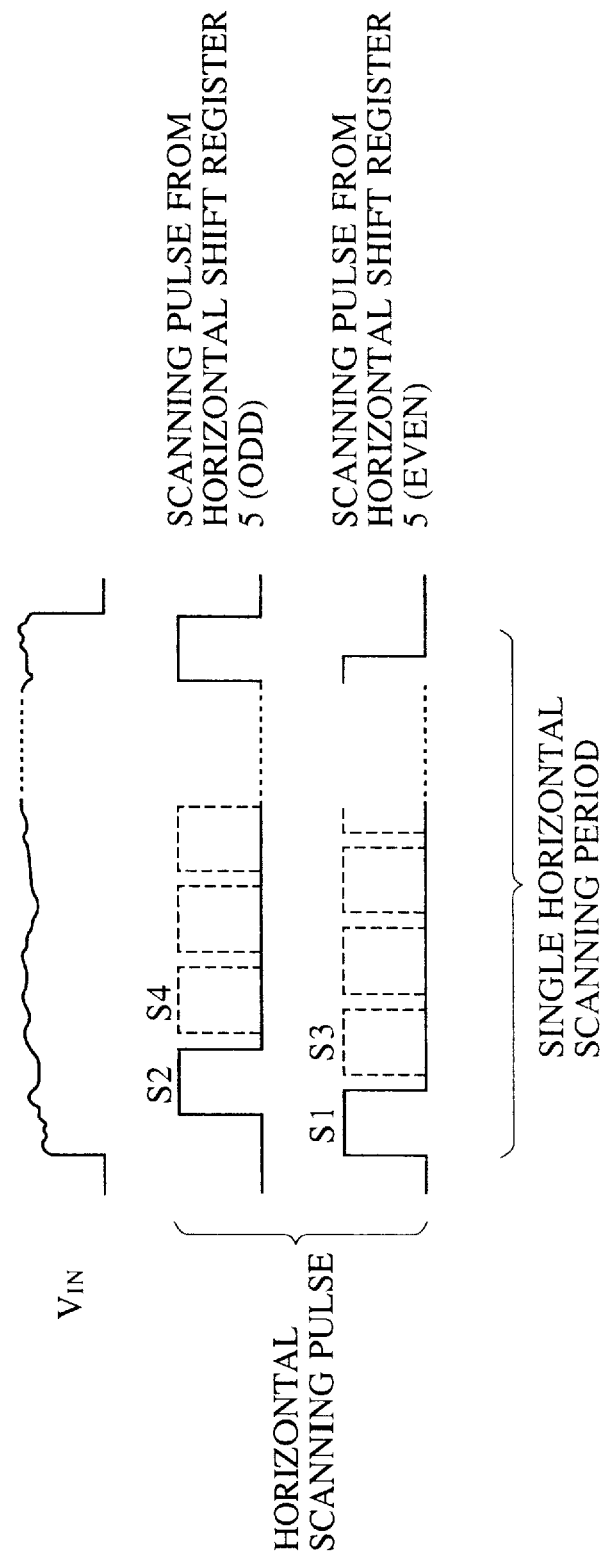

LIQUID CRYSTAL DISPLAY DEVICE HAVING A CAPACITOR IN THE PERIPHERAL DRIVING CIRCUIT

BACKGROUND OF THE INVENTION

1. Field of the Invention

The present invention relates to a liquid crystal display device employed for displaying high-resolution pictures, such as television images.

2. Description of the Related Art

Simple matrix type liquid crystal display devices have a structure in which a pair of substrates each having a stripe-shaped electrode are disposed in opposed relation in such a manner that the electrodes of the two substrates intersect each other to form a matrix. The simple matrix liquid crystal display devices are adequate for displaying time or simple images. They cannot, however, be employed for displaying high-resolution pictures, such as television pictures, because those displays require extremely large number of pixels and because time-division drive control of such a large number of pixels with a simple matrix drive liquid crystal display device is impossible. In other words, a simple matrix drive has a limitation in terms of the time-division drive. Hence, in recent years, an active matrix drive has been developed and made available in the market to replace the simple matrix drive.

Active matrix type liquid crystal display devices fall into two types: a two-terminal type which employs switching elements which operate as diodes and a three terminal type which employs switching elements as transistors. Three-terminal type active matrix drive liquid crystal display devices have a structure in which a common electrode is provided on one of the substrates and a pixel electrode is provided on the other substrate for each pixel and in which a thin-film transistor (hereinafter referred to as a TFT) is disposed and controlled for each pixel electrode as a switching element.

The electrodes of a TFT consist of two main electrodes, called a source electrode and a drain electrode, and a control electrode called a gate electrode. One of the main electrodes is connected to a single line, the other main electrode is connected to the pixel electrode. The gate electrode is connected to a scanning line.

Whether a main electrode is a source electrode or a drain electrode depends on the type of a transistor and the polarity of an applied voltage. In this specification, the main electrode connected to the display signal line is the source electrode, and the main electrode connected to the pixel electrode is the drain electrode.

FIG. 17 shows an equivalent circuit of an active matrix type liquid crystal display device. In FIG. 17, reference numeral 1 denotes a TFT. Reference numeral 2 denotes a scanning line. Reference numeral 3 denotes a signal line. Reference numerals 4(1)–4(x+2) denote pixel electrodes. Reference numeral 5 denotes a horizontal shift register. Reference numeral 6 denotes a vertical shift register. Reference numeral 7 denotes a video signal transfer switch driven by the horizontal shift register. Reference numeral 8 denotes a holding capacitor for temporarily holding a video signal. Reference numeral 9 denotes a second video signal transfer switch for transferring the video signal temporarily held in the holding capacitor to the pixel electrode. Video signals are transferred in sequence from a video signal input terminal 10. Reference numeral 11 denotes a reset switch for signal line 3.

FIG. 18 illustrates driving pulse timings of an active matrix liquid crystal display device. Regarding a video signal, a signal corresponding to odd lines and a signal corresponding to even lines arrive alternately in each field. Thus, to operate the liquid crystal display device, a scanning signal is first sent to an odd scanning line (ODD1) from the vertical shift register 6 in an odd field to turn on the TFTs 1 on the odd line. In the meantime, the video signal to be recorded in the liquid crystal is recorded in the pixel electrodes 4 (2) and 4 (4) of the pixels through the transfer switches 7 driven in sequence by the horizontal shift register 5 (ODD) which produces a horizontal scanning pulse synchronously with that video signal.

At the same time, the video signal is transferred to the holding capacitors 8 through the transfer switches 7 driven in sequence by the horizontal shift register 5 (EVEN) for producing a horizontal scanning pulse synchronously with the video signal. Next, the reset switches 11 are turned on in a horizontal blanking period to reset the signal lines 3, and then a scanning signal is sent to an even scanning line (EVEN 1) to turn on the TFTs 1 on the even line. At the same time, the second video signal transfer switches 9 are turned on to record a video signal in the pixel electrodes 4 (1) and 4 (3). Thus, a video signal is recorded in sequence in the pixel electrodes.

The liquid crystal molecules constituting the cell shift relative to the thus-transferred signal voltage, whereby the transmittance of the liquid crystal varies depending on the direction of the polarizing plates provided in relation to a cross-polarizer. This is illustrated in FIG. 19.

It is known that the contents of a signal voltage value $V_{SIG}$, indicated by the abscissa axis of a graph shown in FIG. 19(a), differ depending on the used liquid crystal. When, for example, twist nematic (TN) liquid crystal is used, the signal voltage value $V_{SIG}$ is defined as an effective voltage value ($V_{rms}$). Qualitative description of the effective voltage value ($V_{rms}$) will be made with reference to FIG. 19(b). In a signal voltage whose polarity is varied for each frame in order to prevent application of a dc component to the liquid crystal, an ac voltage component, indicated by a hatched portion in FIG. 19(b), is used to operate the liquid crystal. Thus, the effective voltage $V_{rms}$ is expressed by the following expression:

$$V_{rms} = \sqrt{\frac{1}{t_F} \int_0^{tF} (V_{LC}(t) - V_{com})^2 dt}$$

where $t_F$ is the time for one frame, and $V_{LC}(t)$ is the signal voltage transferred to the liquid crystal.

The greater the effective voltage $V_{rms}$, the higher the transmittance of the liquid crystal.

As the means of improving the resolution in the horizontal direction, the position of the pixels on the odd lines may be shifted from the position of the pixels on the even lines by, for example, 0.5 pixel, as shown in FIG. 20. In this way, the gap between the adjacent pixels on the odd line is filled up with a pixel on the even line when seen in the horizontal direction, and the horizontal resolution is thus improved virtually. At that time, timing of the horizontal scanning pulse must be shifted between the odd and even lines so as to match the spatial deviation between the odd and even lines, as shown in FIG. 20.

Further, in order to prevent burning of the liquid crystal in the liquid crystal display device caused by the application of a dc component, as mentioned above, the polarity of an applied signal voltage is inverted periodically. During switching of the polarity, the transmittance of the liquid crystal cell slightly changes. If changes in the transmittance occur in a period of, for example, 1/30 second, the user can recognize such change as variations in the brightness, that is, flicker. The polarity inversion period of a video signal can be reduced to one half, i.e., 1/60 second, so as to restrict flicker by employing the above-described two-line simultaneous driving method in which the same video signal is written in both the odd and even lines.

Conventional liquid crystal display devices are generally constructed by using polycrystalline silicon or amorphous silicon TFTs formed on quartz or glass. Thus, the holding capacitors are also formed by using an insulator film on polycrystalline silicon or amorphous silicon.

However, the surface of polycrystalline silicon is irregular, and the surface of an insulator film formed on that polycrystalline silicon is also irregular, making the thickness thereof irregular. Thus, the withstand voltage is reduced, reducing reliability and hence yield. The withstand voltage of an insulator film may be increased by increasing the thickness of the insulator film. However, it increases the area required to obtain a necessary holding capacitance, thus increasing the chip size and hence production cost.

Insular films on amorphous silicon are generally formed by CVD (chemical vapor deposition) process. However, since they have many pinholes, the withstand voltage and hence reliability and yield are reduced, as in the case of the insulator films on polycrystalline silicon. In order to obtain sufficient withstand voltage, the thickness of the insulator film may be increased. However, it increases the chip size and hence production cost.

Liquid crystal display devices in which transistors are formed on a monocrystalline substrate have also been proposed. However, since the silicon monocrystalline substrate is generally opaque relative to visible light, usage thereof is limited to reflection type liquid crystal display device, that is, silicon monocrystalline substrate cannot be used in transmission type liquid crystal display device which is excessively used in personal computers or televisions.

SUMMARY OF THE INVENTION

In view of the aforementioned problems, an object of the present invention is to provide a liquid crystal display device in which a pixel switching element is formed of amorphous silicon, polycrystalline silicon or monocrystalline silicon and in which a holding capacitor for temporarily holding a video signal is formed by using an insulator film formed on monocrystalline silicon as a dielectric layer.

To this end, the present invention provides a liquid crystal display device which includes a transparent substrate, a monocrystalline semiconductor substrate containing a peripheral driving circuit, and a liquid crystal material sandwiched between said pair of substrates. An insulation area formed on the monocrystalline semiconductor substrate is used as a dielectric portion of capacitor means in the peripheral driving circuit.

The dielectric constituting the capacitor according to the present invention may be a silicon oxide film, a silicon nitride film or an ONO (oxidized nitrided oxide) film. Further, the present invention can be applied not only to a transmission type liquid crystal display device but also to a reflection type liquid crystal display device if a transparent electrode provided below the liquid crystal is replaced with a metal electrode which reflects light and if the portion of the silicon substrate provided below a pixel is not cut off. The capacitance of the capacitor means of a peripheral driving circuit in the liquid crystal display device according to the present invention is between 5 pF and 25 pF.

The capacitor means according to the present invention can be used as, for example, a phase compensation capacitor, a bootstrap capacitor of a bootstrap type shift register or a holding capacitor of a video signal. Further, it is desirable that the semiconductor substrate according to the present invention be a monocrystalline Si substrate. Furthermore, the liquid crystal display device according to the present invention is particularly advantageous when it is of an active matrix type which employs a switching element for each pixel. In that case, it is desirable that the switching element be a thin-film transistor. The thin-film transistor may be formed of monocrystalline Si, polycrystalline Si or amorphous Si.

In the present invention, since the holding capacitor for temporarily holding a video signal is formed by using, as a dielectric layer, an insulator layer formed on the monocrystalline silicon, it has a small size and a large capacitance. As a result, the liquid crystal display device according to the present invention produces high-resolution images, has less flicker and is thus highly reliable. The present invention can thus be applied to a high image quality liquid crystal television, a liquid crystal projector television, a liquid crystal view finder, a liquid crystal head-mount display or a computer display.

BRIEF DESCRIPTION OF THE DRAWINGS

FIG. 1 is a schematic cross-sectional view of a first embodiment of the present invention;

FIGS. 8(a) and 8(b) illustrate manufacturing processes of the first embodiment;

FIG. 20 shows the driving timings of the liquid crystal display device.

DETAILED DESCRIPTION OF THE PREFERRED EMBODIMENTS

Figure 2A:
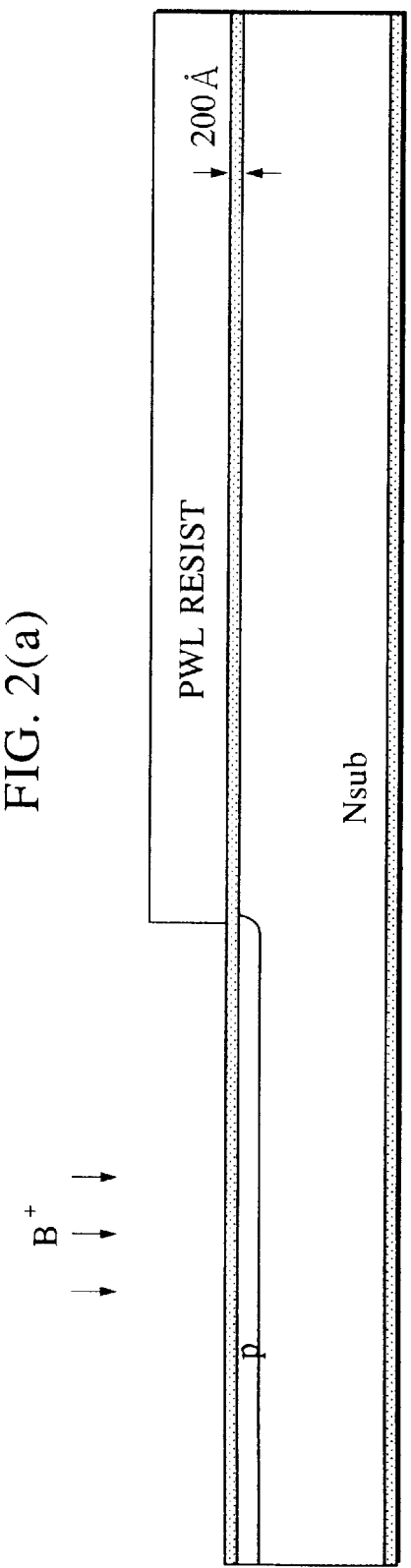
FIGS. 2(a) and 2(b) illustrate manufacturing processes of the first embodiment.

The preferred embodiments of the present invention will now be described with reference to the accompanying drawings.

First Embodiment

In a first embodiment of the present invention, a liquid crystal display device having a transparent substrate and a monocrystalline semiconductor substrate having a peripheral driving circuit comprising capacitor means is employed. Sandwiched between the transparent substrate and the monocrystalline semiconductor substrate is a liquid crystal material. Applicants have unexpectedly found that high resolution images with less flicker can be obtained when an insulation area formed on the monocrystalline semiconductor substrate is used as a dielectric portion of a capacitor means in the peripheral driving circuit. FIG. 1 illustrates the cross-sectional structure of an active matrix liquid crystal display device and shows certain features of the present invention.

In FIG. 1, reference numeral 401 denotes a gate electrode of a thin-film transistor. Reference numeral 402 denotes a semiconductor layer which is made of, for example, monocrystalline silicon, polycrystalline silicon or amorphous silicon to form a channel area of the thin-film transistor. Reference numeral 403 denotes a source electrode. Reference numeral 404 denotes a drain electrode. Reference numeral 405 denotes an interlayer insulator film. Reference numeral 406 denotes a monocrystalline silicon substrate. Reference numeral 407 denotes an orientation film. Reference numeral 408 denotes a liquid crystal material. Reference numeral 409 denotes an opposed transparent electrode. Reference numeral 410 denotes an interlayer film. Reference numeral 411 denotes a light blocking layer. Reference numeral 412 denotes a color filter layer. In the case of a monochrome display panel, no color filter layer exists. Reference numeral 413 denotes an opposed transparent substrate. Reference numeral 414 denotes a semiconductor diffused layer formed in the monocrsytalline silicon substrate to form a channel area of a transistor and having a conductive type opposite that of the monocrystalline silicon substrate.

Reference numeral 415 denotes a gate electrode which is formed in this embodiment by the same process as that in which the gate electrode 401 of the transistor is formed. However, the gate electrode 415 may be formed by another process. The gate electrode 415 and the channel area 414 oppose each other with an insulator layer therebetween. Reference numerals 416 and 417 are respectively source and drain electrodes of a transistor which are formed in the monocrsytalline substrate. Reference numeral 418 denotes an electrode of the semiconductor diffused area 414. Reference numeral 419 denotes a transparent pixel electrode connected to the drain electrode 404. Reference numeral 420 denotes a storage capacitor common electrode which forms a storage capacitor for holding electric charges of the pixel electrode portion. The common electrode 420 and the pixel electrode 419 in combination form a storage capacitor, which is omitted in FIG. 1.

In this embodiment, a dielectric formed between the gate electrode 415 of the monocrystalline transistor formed in the monocrystalline silicon substrate and an inverted layer of the channel area 414 thereof is used as a holding capacitor for a video signal. The dielectric is formed of silicon oxide. A video signal is held at the gate electrode 415 and recorded in the pixel electrode at a desired timing. The pixel area consists of the thin-film transistor formed on the interlayer insulator film 405 and the transparent pixel electrode 419 Connected to the drain electrode of that thin-film transistor. The portion of the monocrystalline silicon substrate, located below the pixel area, is removed by etching, as shown in FIG. 1 so that it can be seen through under visible light.

The holding capacitor is constituted using, as a dielectric layer, the insulator film formed on the monocrystalline substrate. The pixel area portion, which is constituted by the thin-film transistor on the interlayer insulator film and the transparent electrode, has a structure in which the portion of the silicon substrate layer located below the pixel area portion is removed by etching so that it can be seen through. It is thus possible to provide a transmission type liquid crystal display device having a highly reliable holding capacitor. The withstand voltage of the oxide film on the monocrystalline silicon is, for example, about 3 MV/cm. Where the liquid crystal display device is operated at 12 volts, if the thickness of the oxide film is 400 Å or above, sufficient insulation can be obtained. In contrast, a conventional insulator film on the polycrystalline silicon or amorphous silicon must have a thickness of about 1000 Å for the above-described reasons. Accordingly, where a holding capacitor equivalent to that provided in the present invention is formed, the area thereof must be 2.5 times that of the area of the holding capacitor according to the present invention. Consequently, the chip size is increased.

FIGS. 2 to 9 schematically illustrate the method of manufacturing the above-described structure.

Figure 2B:
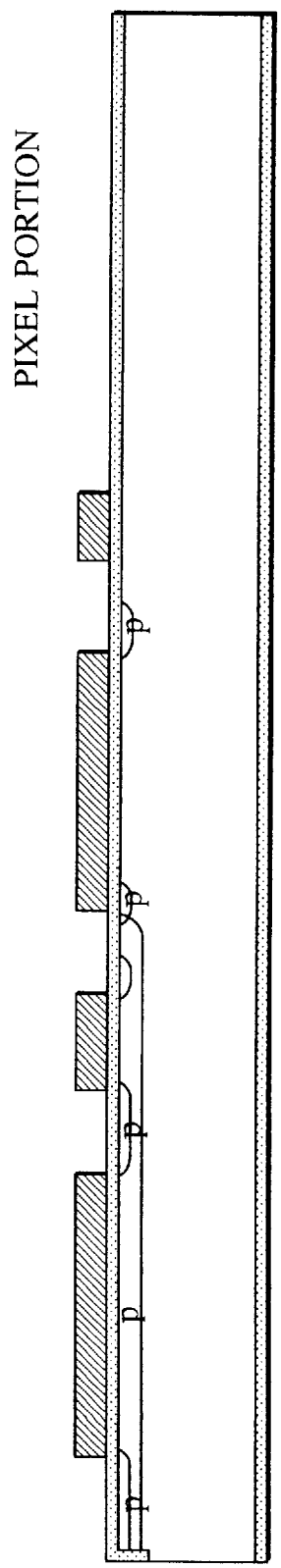

FIG. 2(a) illustrates a process in which a p type well is formed in a n type Si substrate. The p type well is manufactured by masking an oxide film formed on the substrate using a resist and by implanting boron ions. FIG. 2(b) illustrates a process in which a resist used for LOCOS (localized oxidation of silicon) is pasted. After the surface has been oxidized SiN (an oxidized nitrided film) is deposited on the surface and patterned.

Figure 3A:
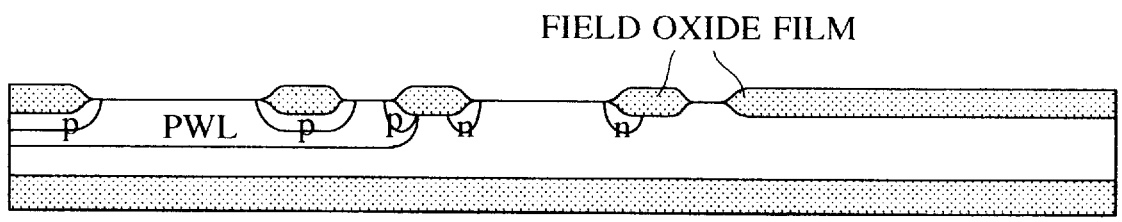
FIGS. 3(a), 3(b) and 3(c) illustrate manufacturing processes of the first embodiment.
Figure 3B:
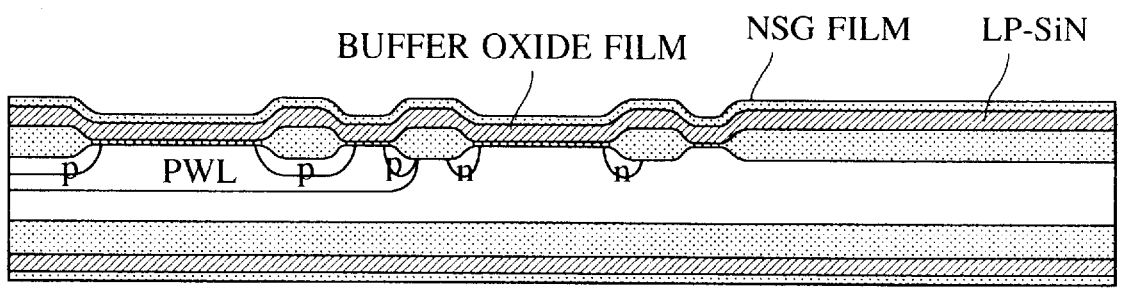
Figure 3C:
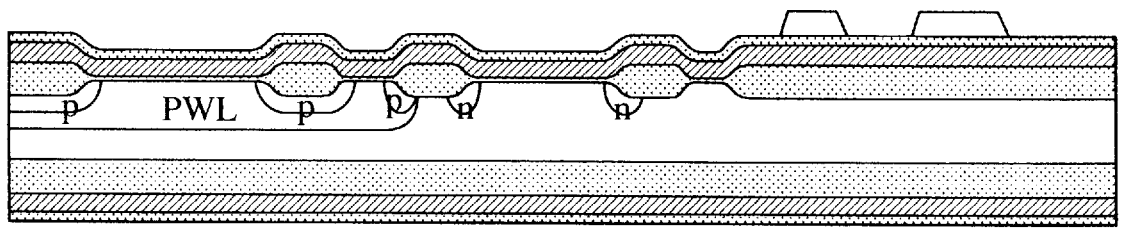

FIG. 3(a) illustrates a process in which LOCOS is formed. An oxide film having a thickness of 400 nm to 1500 nm is formed at a region where SiN has been removed by conducting wet oxidation at a temperature ranging from 1000° to 1100° C. FIG. 3(b) illustrates a process in which SiN is formed on the surface. A SiN film is deposited to a thickness of 50 nm to 300 nm by thermal CVD. Formation of the SiN film may be eliminated. FIG. 3(c) illustrates a process in which polycrystalline Si which forms pixel TFTs is formed on the surface. Polycrystalline Si is deposited to a thickness of 50 to 400 nm and patterned to form a source/drain contact area of a TFT. Thereafter, polysilicon constituting a TFT channel is deposited to a thickness of 10 nm to 100 nm.

Figure 4A:
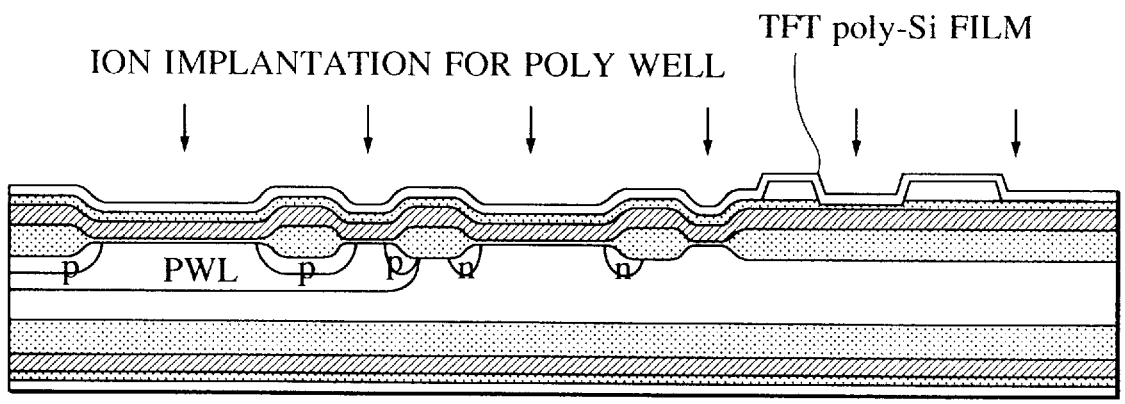
FIGS. 4(a), 4(b) and 4(c) illustrate manufacturing processes of the first embodiment.
Figure 4B:
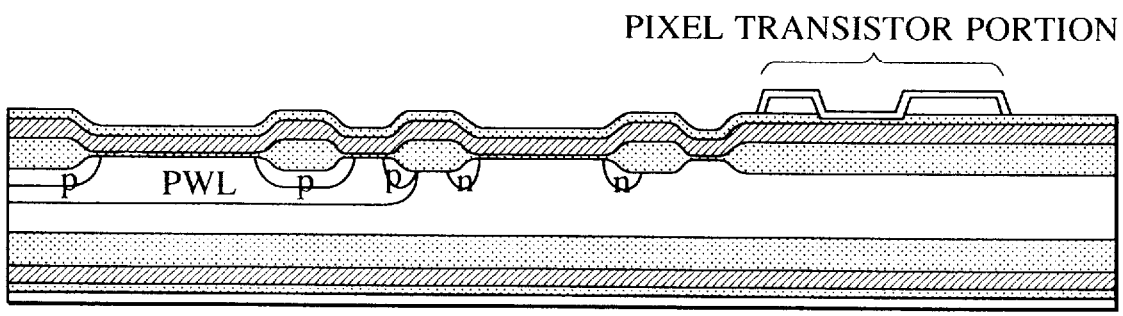
Figure 4C:
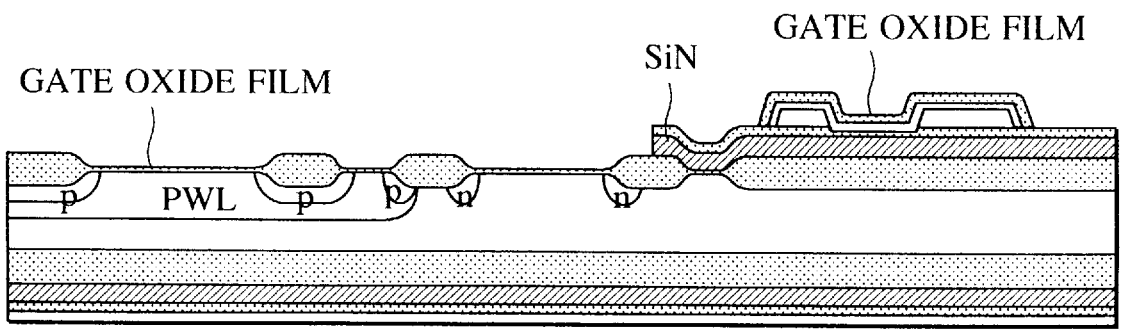

FIG. 4(a) illustrates a process in which p type ions are implanted to adjust the threshold value of the n type TFT. Ion implantation is conducted at a density of $10^{12}$ to $10^{14}$ $cm^{-3}$. FIG. 4(b) illustrates a process in which polycrystalline Si deposited on the portion other than the upper surface of TFT is removed. FIG. 4(c) illustrates a process in which a nitride film formed on the portion other than the lower surface of TFT is removed to expose the peripheral circuit alone.

Figure 5A:
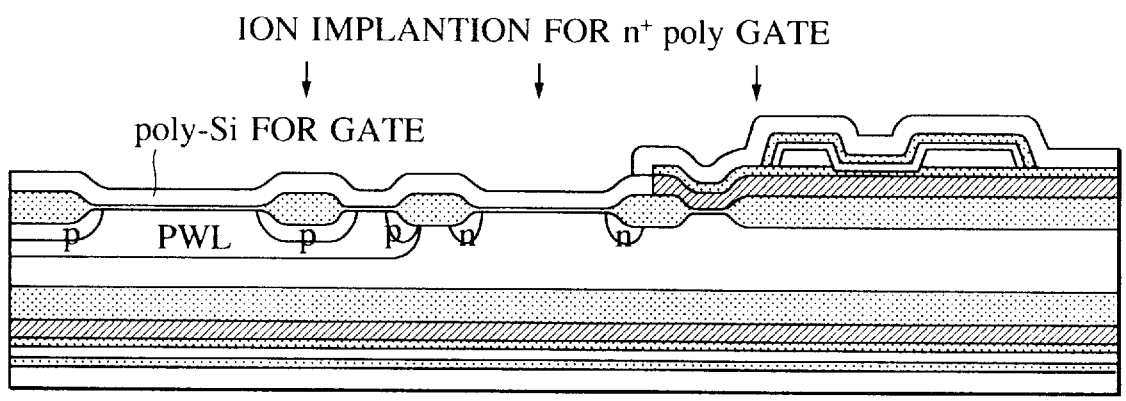
FIGS. 5(a) and 5(b) illustrate manufacturing processes of the first embodiment.
Figure 5B:
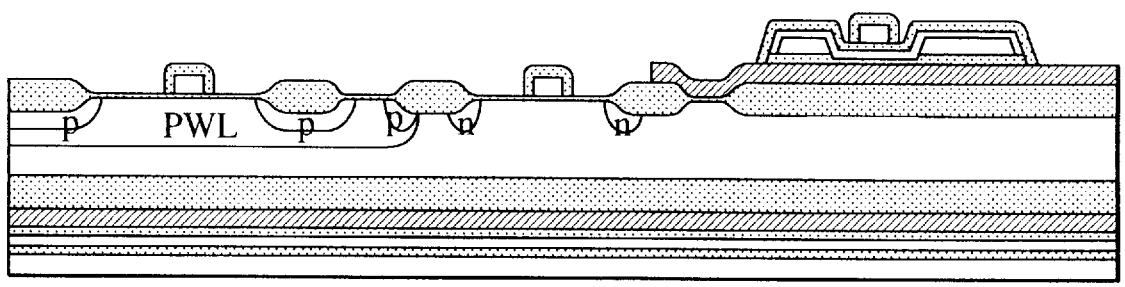

FIG. 5(a) illustrates a process in which polycrystalline Si for a gate electrode is formed. FIG. 5(b) illustrates the patterning process for the gate electrode. In these processes, the gate of the pixel TFT, the gate of the monocrystalline transistor of the peripheral circuit and the upper electrode of the capacitor element can be formed at the same time.

Figure 6A:
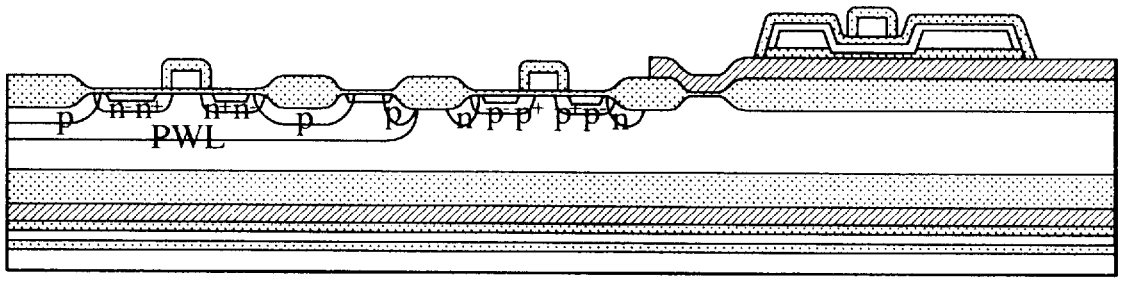
FIGS. 6(a) and 6(b) illustrate manufacturing processes of the first embodiment.
Figure 6B:
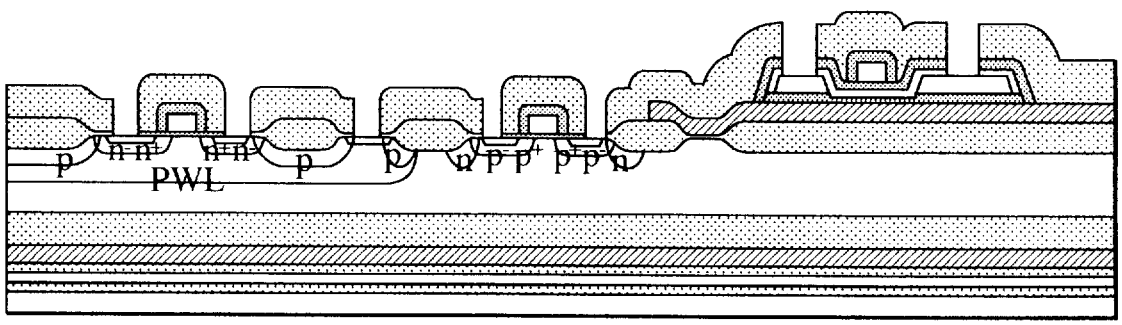

FIG. 6(a) illustrates a process in which ion implantation is conducted on the TFT and peripheral circuit portion to form the source area and drain area. In order to improve the withstand voltage, the source and the drain may have the offset structure, the LDD structure or the DDD structure. FIG. 6(b) illustrates formation of the interlayer film. In this process, a PSG film is deposited by CVD, and then a contact hole is formed in the film.

Figure 7A:
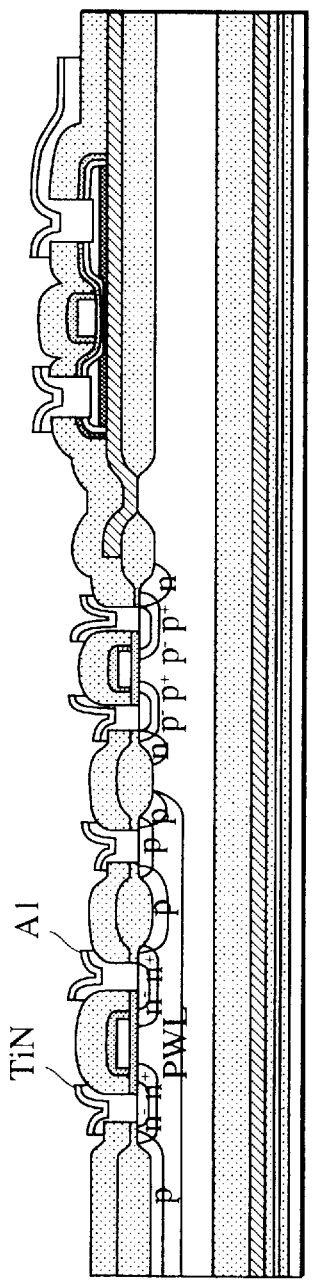
FIGS. 7(a), 7(b) and 7(c) illustrate manufacturing processes of the first embodiment.
Figure 7B:
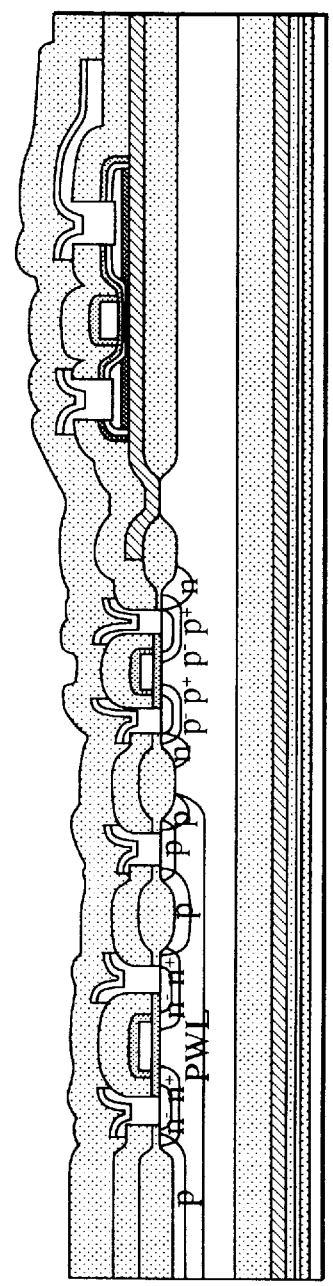
Figure 7C:
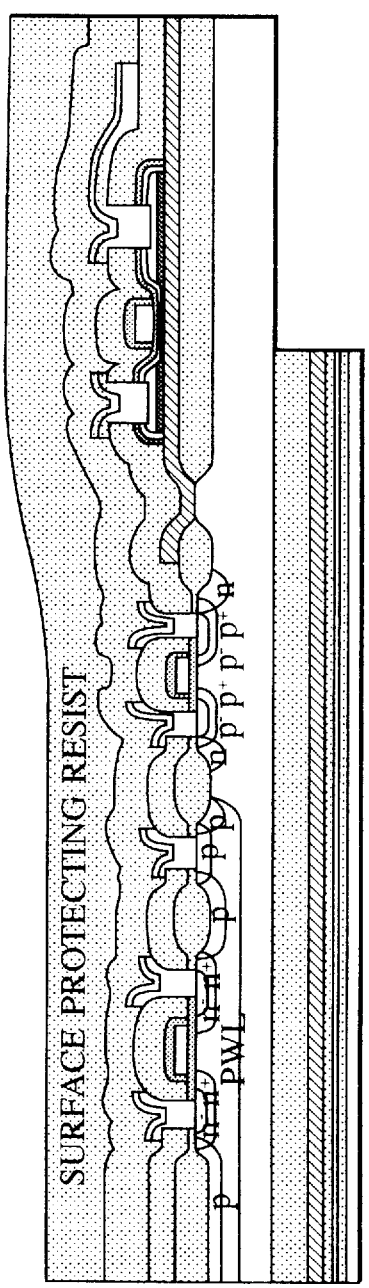

FIG. 7(a) illustrates a process in which Al—Si is deposited to form an extension electrode. FIG. 7(b) illustrates a process in which the interlayer insulator film is formed. FIG. 7(c) illustrates a process in which an image display portion is made transparent by coating a front surface protecting resist and by removing the rear surface of the substrate by etching. After the protective resist is coated on the front surface of the substrate, a resist is coated on the rear surface and patterned. Thereafter, the rear surface of the substrate is removed by etching using the resist as a mask. Etching is conducted until the silicon oxide film is exposed.

FIG. 8(a) illustrates a process in which TiN for shielding the TFT from light is deposited on the upper surface of TFT. FIG. 8(b) illustrates a process in which the transparent pixel electrode, which may be ITO, is formed. The holding capacity of a pixel can be formed by both the light shielding TiN and ITO.

Figure 9:
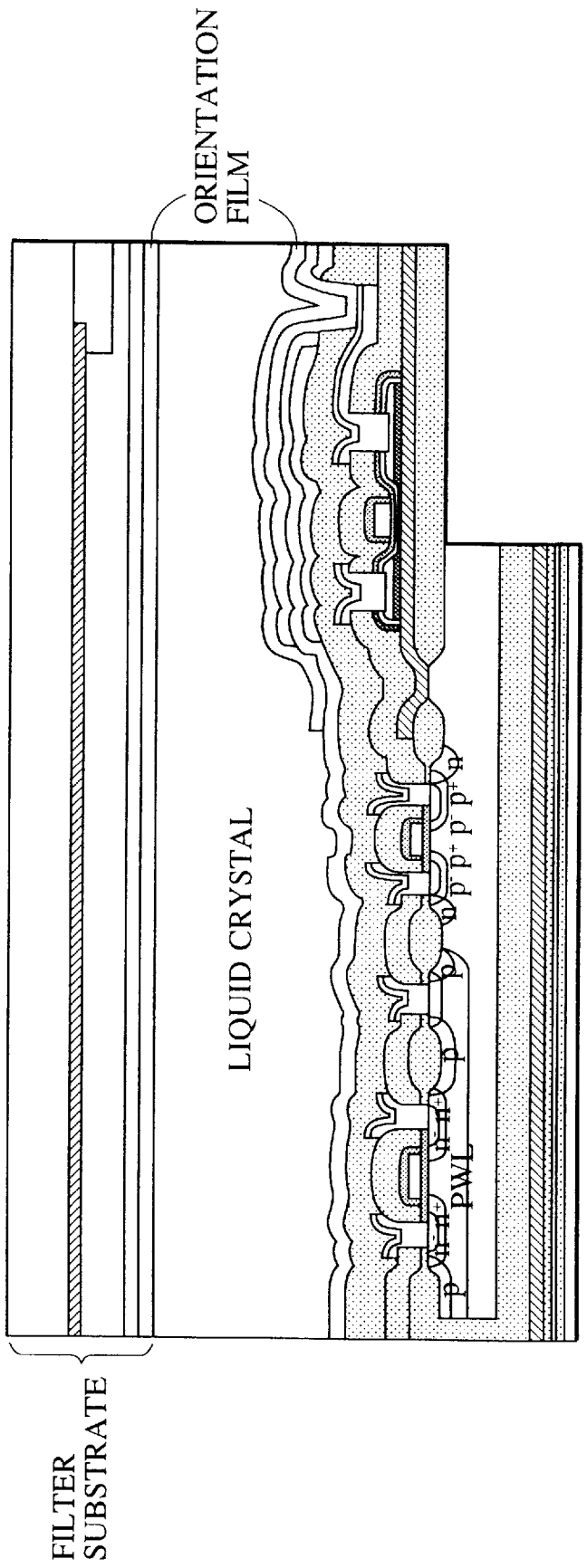
FIG. 9 illustrates a manufacturing process of the first embodiment.

FIG. 9 is a cross-sectional view of a liquid crystal display device completed by combining the thus-obtained substrate with an opposed substrate having the common electrode.

In this way, it is possible to form the transistor and capacitor element of a peripheral driving circuit using monocrystalline silicon while using a TFT (thin-film transistor) as the switching element of the image display portion.

While the preferred embodiment of the invention employs, as the capacitor, the inverted layer of the channel portion of the monocrystalline transistor, alternate embodiments contemplate, for example, a liquid crystal display device in which the portion of the silicon layer located below the gate electrode between the electrode 418 of the semiconductor diffused layer 414 and the gate electrode 415 is used under bias conditions which ensure a stored state of the silicon layer, and a liquid crystal display device in which a high-concentration diffused layer is formed in the portion of the silicon layer below the gate electrode so as to achieve a stored stage of the silicon layer and thereby allow the silicon layer to be used as one of the electrodes of the holding capacitor.

Figure 10:
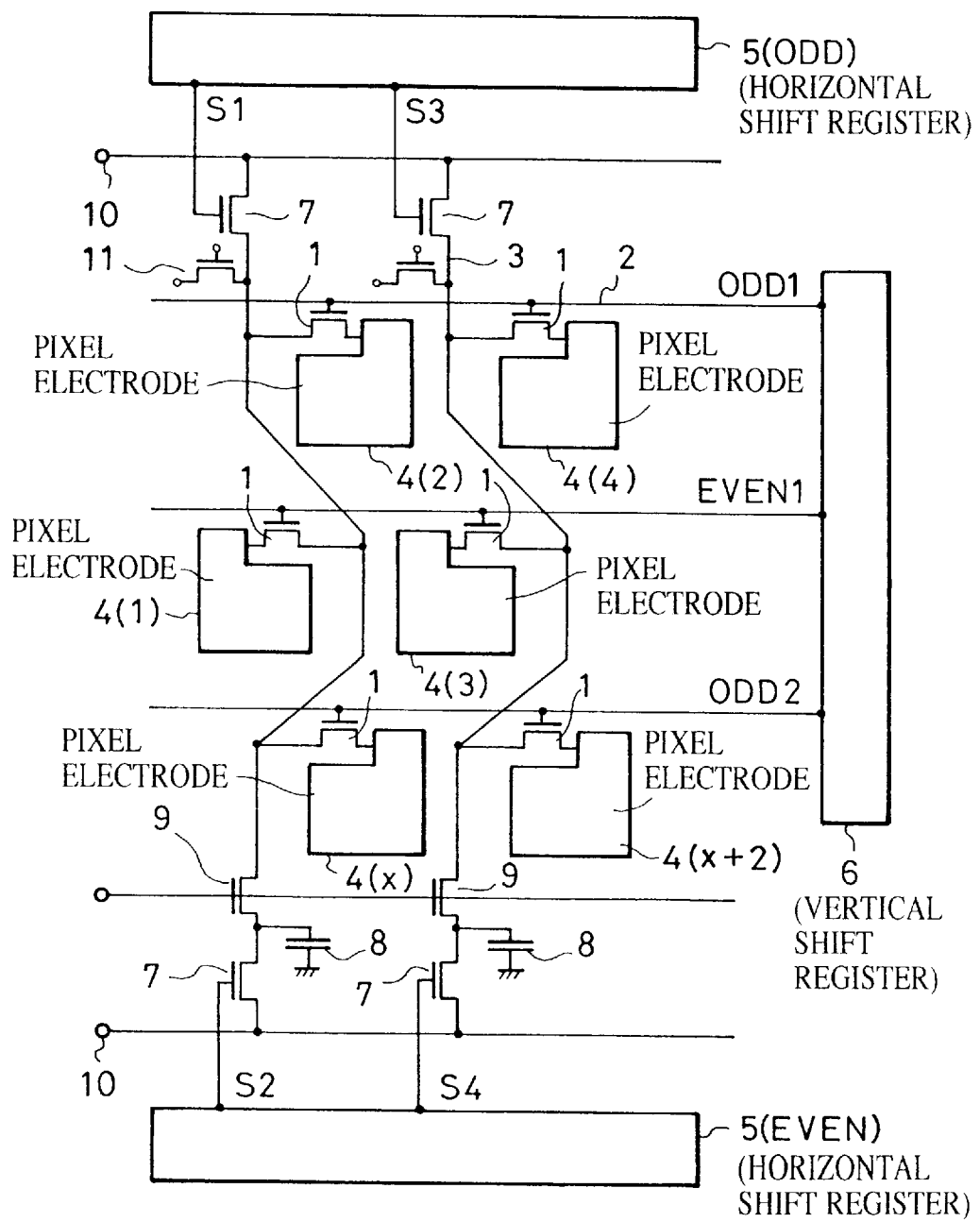
FIG. 10 shows an equivalent circuit of a liquid crystal display device according to the first embodiment of the present invention.

FIG. 10 illustrates an equivalent circuit of this embodiment. In FIG. 10, the holding capacitor of a video signal according to the present invention is indicated by reference numeral 8. While the preferred embodiment is shown as employing a N type MOS transistor as a switch, alternate embodiments of a liquid crystal display device might include a P type MOS transistor or a CMOS transistor as the switch. Particularly, in the case of a liquid crystal display device which employs a CMOS transistor as the switch, fluctuation of the signal line 3 caused by the gate capacitor of the switch can be reduced by providing a dummy switch. In this way, application of a DC voltage to the liquid crystal can be prevented.

Second Embodiment

Figure 11:
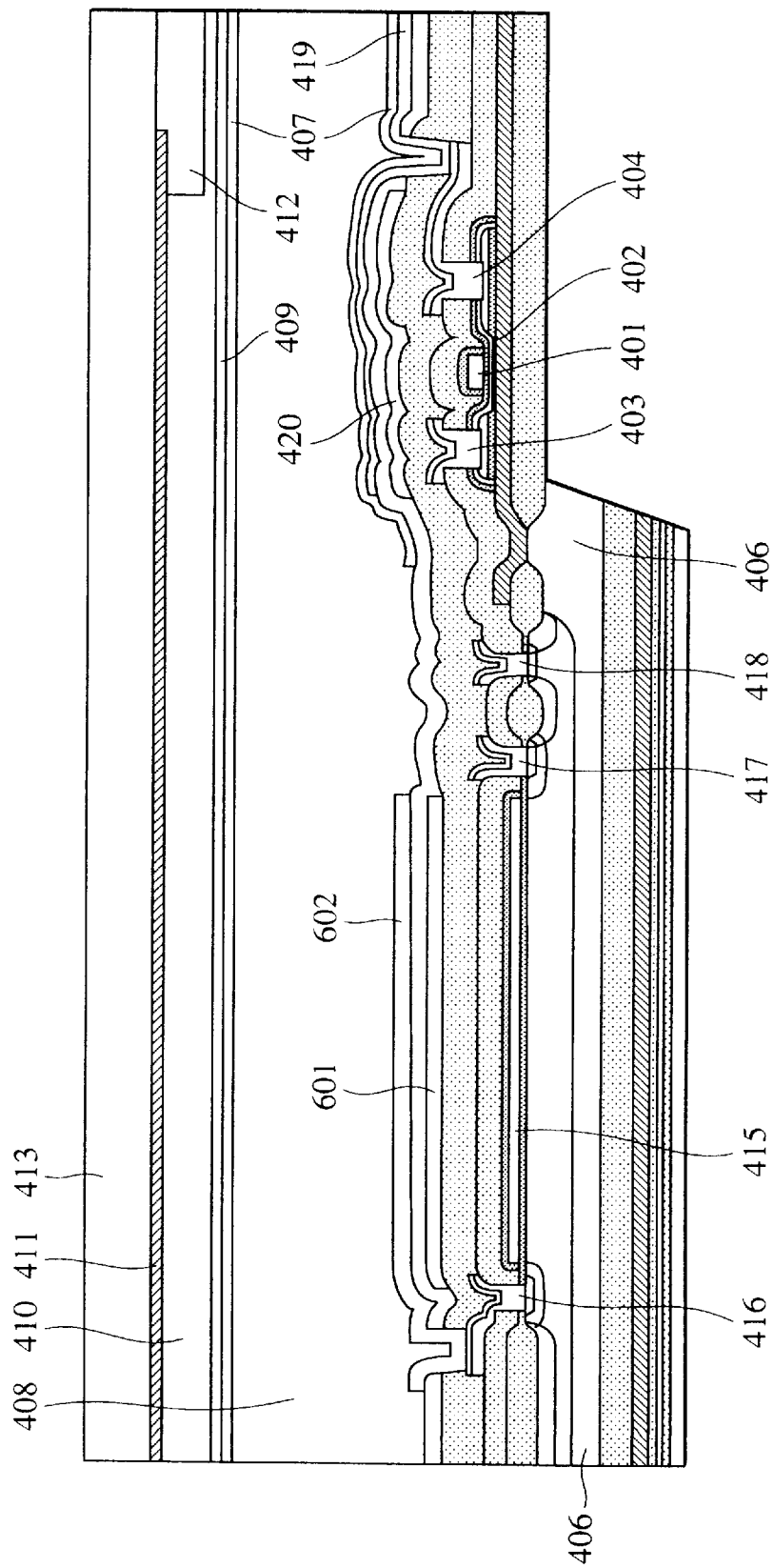
FIG. 11 is a schematic cross-sectional view of a second embodiment of the present invention.

In a second embodiment, a second holding electrode employing a transparent electrode (ITO) as an electrode and an interlayer insulator film, a Si nitride film or a Si oxide film as a dielectric is formed in addition to the structure of the first embodiment. FIG. 11 shows the features of the second embodiment of the present invention. In FIG. 11, reference numeral 601 denotes an electrode formed in the same process as that in which the storage capacitor common electrode 420 is formed. Although not shown in FIG. 11, the electrode 601 is connected to the electrode 415 of the holding capacitor. Reference numeral 602 denotes an electrode formed in the same process as that in which the pixel electrode 419 is formed. Although not shown in FIG. 11, the electrode 602 may be connected to the source electrode 417 and the electrode 418. In this way, the second holding capacitor can be formed between the electrodes 601 and 602 and parallel to the above-described holding capacitor.

In this embodiment, since the second holding capacitor is formed on the holding capacitor which employs the insulator film on the single crystal in the same process as that of the storage capacitor of the pixel portion, the holding capacitance can be increased without increasing the number of manufacturing processes or chip size. Alternatively, the area of the chip required to provide a desired holding capacitor can be reduced, thus further reducing the chip size. If the thickness of the interlayer film formed between the electrodes 601 and 602 is, for example, 1000 Å, the area of the holding capacitor required to obtain the same holding capacitance as that of the first embodiment can be reduced to about 70% of the area of the holding capacitor provided in the first embodiment.

While the present embodiment is shown as employing the second holding capacitor having the same structure as that of the storage capacitor of the pixel portion, alternate embodiments might include a second holding capacitor obtained by forming a new electrode layer of, for example, polycrystalline silicon on the gate electrode to achieve reduction in the chip size.

Third Embodiment

Figure 12:
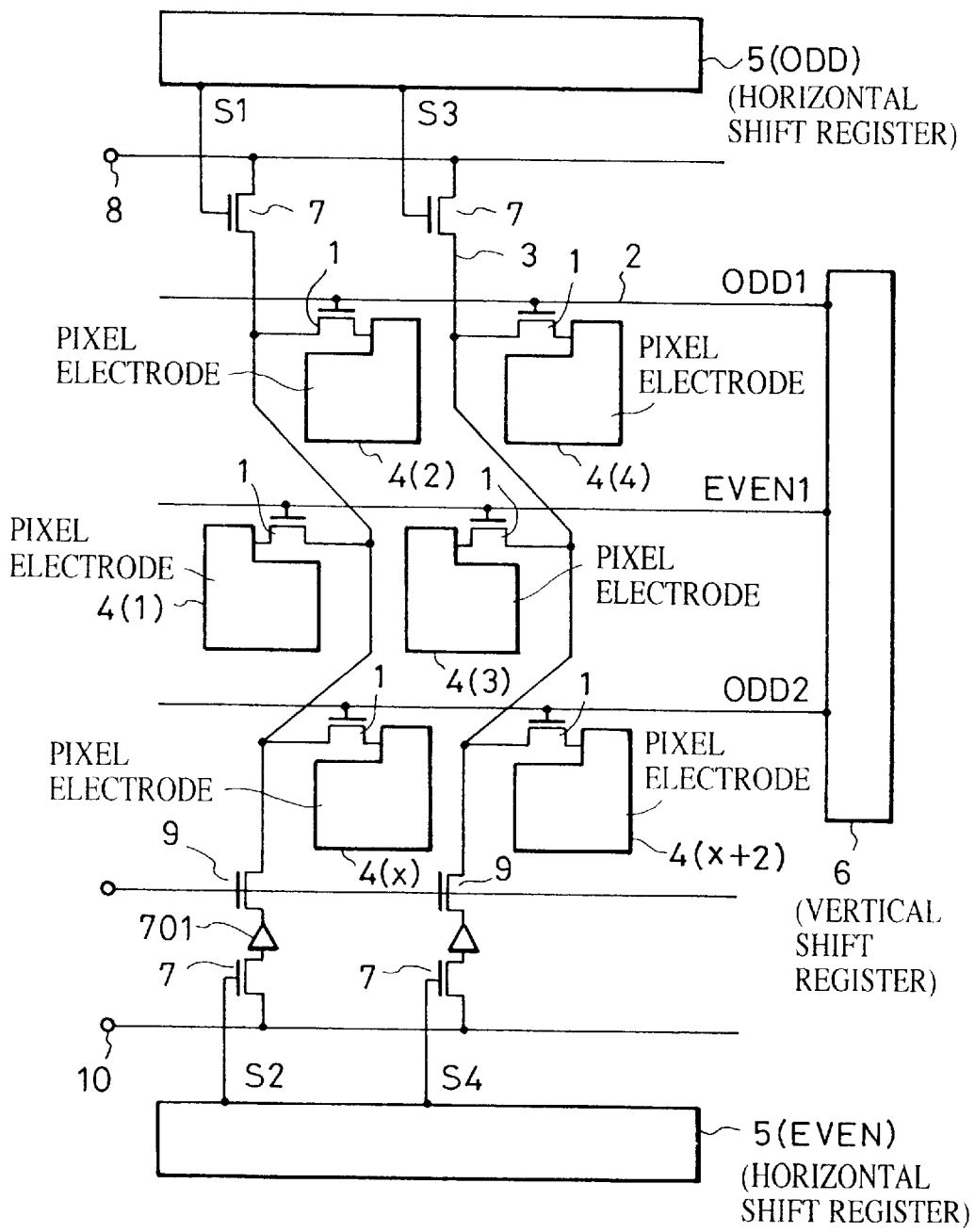
FIG. 12 shows an equivalent circuit of a third embodiment of the present invention.
Figure 13:
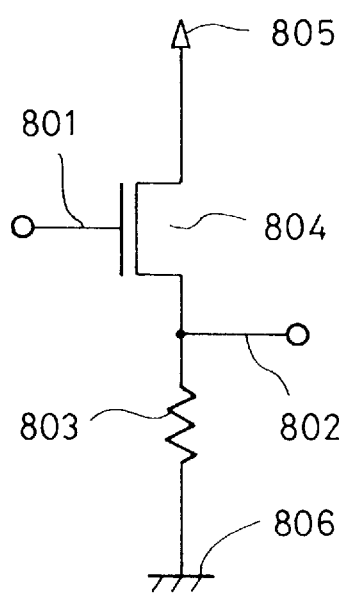
FIG. 13 shows an equivalent circuit of the third embodiment.

In a third embodiment, an amplifier is provided to replace the holding capacitor. The amplifier holds a video signal in a gate capacitor thereof. The amplifier also buffers or amplifies the held signal and transfers that signal to the pixel. FIG. 12 shows the features of the third embodiment. In FIG. 12, reference numeral 701 denotes an amplifier. FIG. 13 shows an example of the amplifier 701. In FIG. 13, reference numeral 801 denotes a signal input terminal connected to the video signal transfer switch 7. Reference numeral 802 denotes an output terminal which is connected to the second video signal transfer switch 9. Reference numeral 803 denotes a load resistor. Reference numeral 804 denotes a MOS (metal oxide silicon) transfer. Reference numeral 805 denotes a power source terminal. Reference numeral 806 denotes a grounding terminal. The above-described components constitute a source follower amplifier.

In the above-described structure in which a video signal held in the holding capacitor is transferred to the pixel at a predetermined timing, since the video signal is read out due to capacitor division between the holding capacitance and the capacitor of the signal line, a holding capacitor, which is large relative to the capacitance of the signal line must be provided to assure a sufficient reading gain. In this embodiment, since the signal reading gain is determined by the structure of the amplifier, the area of the gate portion of the MOS transistor 804 for holding a signal can be reduced as compared with that of the previous embodiment, thus further improving reliability.

The present embodiment is shown as employing a resistance load type source follower amplifier, alternate embodiments might include a constant-current load type source follower amplifier or a differential amplification type amplifier.

Fourth Embodiment

Figure 14:
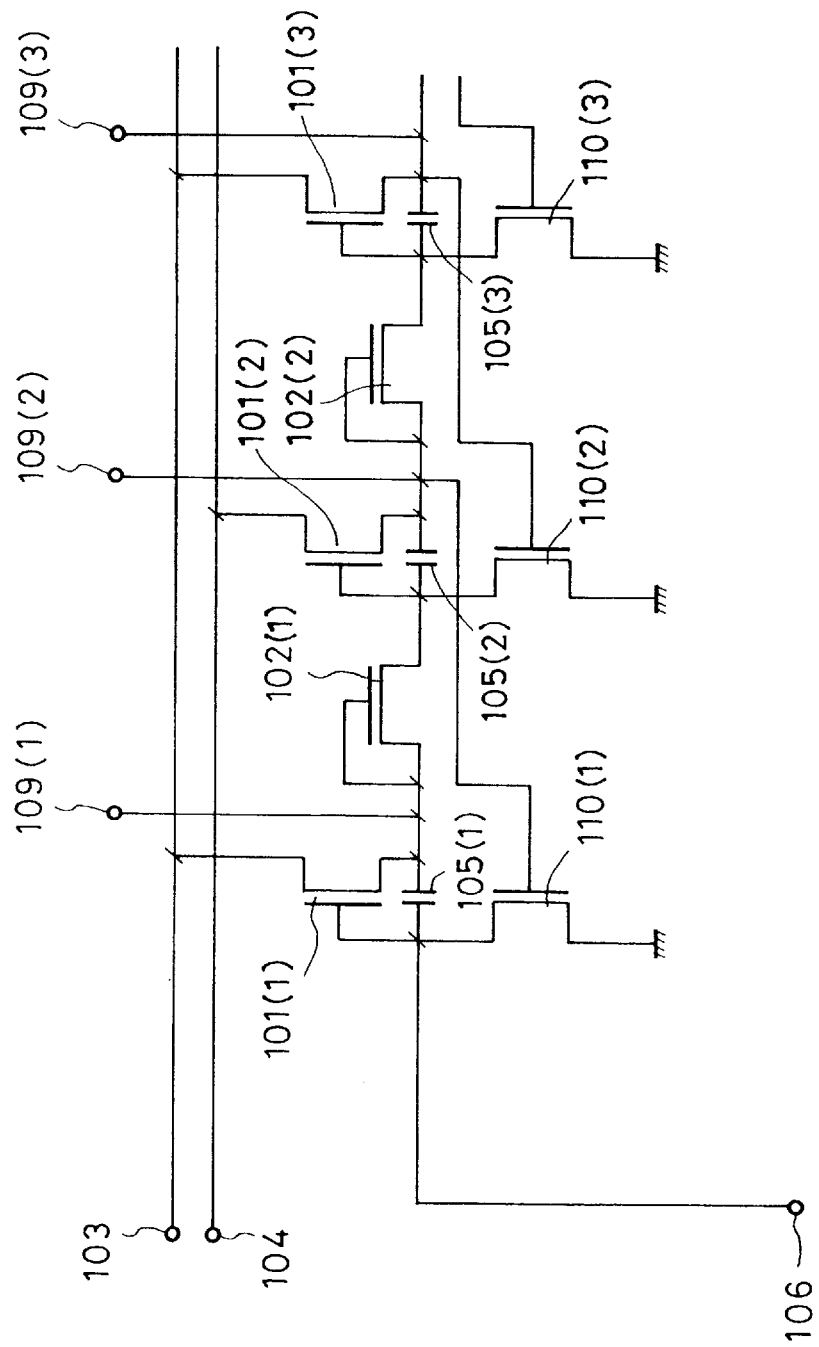
FIG. 14 is a circuit diagram of a bootstrap type shift register.

In a fourth embodiment, the present invention is applied to a bootstrap type shift register employed as the driving circuit of a liquid crystal display device. FIG. 14 shows a circuit of a bootstrap shift resistor. In FIG. 14, reference numerals 101(1)–(3) denote driving transistors. Reference numerals 102(1)–(2) denote pre-charge transistors. Reference numeral 103 denotes a first clock line for sending a first driving pulse. Reference numeral 104 denotes a second clock line for sending a second driving pulse. Reference numerals 105(1)–(3) denote capacitor elements. Reference numeral 106 denotes a starting pulse input terminal. Reference numerals 109(1)–(3) denote output terminals of the shift registers. Reference numerals 110(1)–(3) denote reset transistors which connect the gate line of the driving transistors 101(1)–(3) to the earth.

Figure 15A:
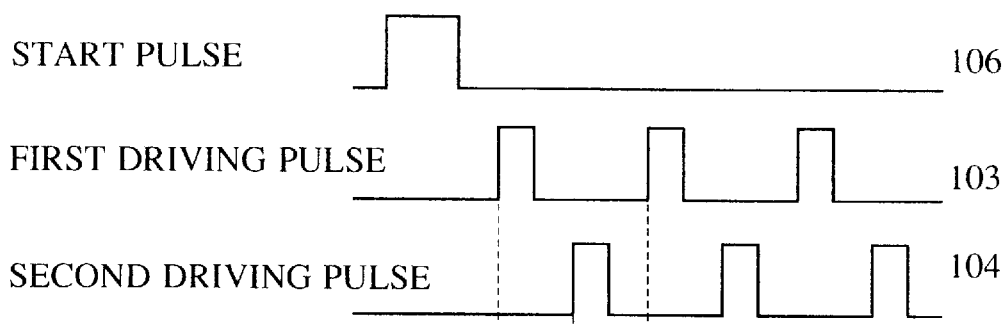
FIGS. 15(a) and 15(b) show driving pulse timings of the bootstrap type shift register.
Figure 15B:
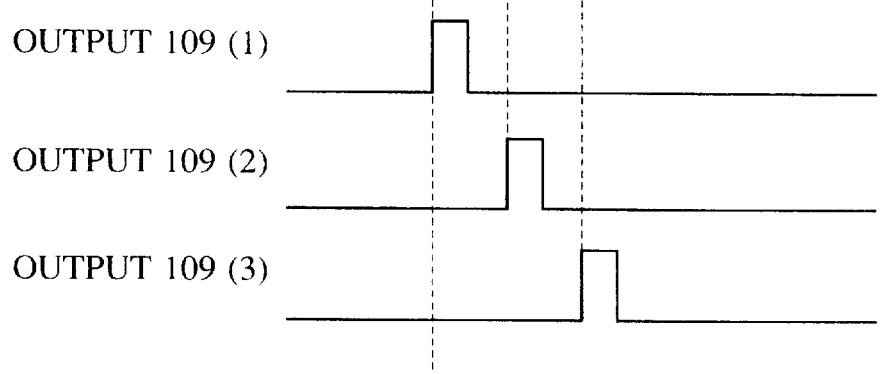

The operation of the fourth embodiment will be described with reference to FIG. 15. In FIG. 15, a starting pulse is applied to the gate of the first-stage driving transistor from the terminal 106 to turn on the driving transistor 101(1). Next, when a first driving pulse is applied from the first clock line 103, a shift pulse is output to the output 109 (1). Concurrently with this, the gate of the subsequent-stage driving transistor is precharged through the pre-charge transistor 102(1). Thereafter, as the driving pulse is alternately applied, a shift pulse is successively output to output terminals 109 (2), 109 (3) . . . .

At that time, a signal having less noise can be transferred to the pixel by applying the present invention to the capacitor 105(1) which assists charging of the gate of the driving transistor 101(1). In addition, the capacitor 105 can be readily formed.

Fifth Embodiment

In a fifth embodiment, the present invention is applied to a monitor circuit in a liquid crystal display device.

Figure 16:
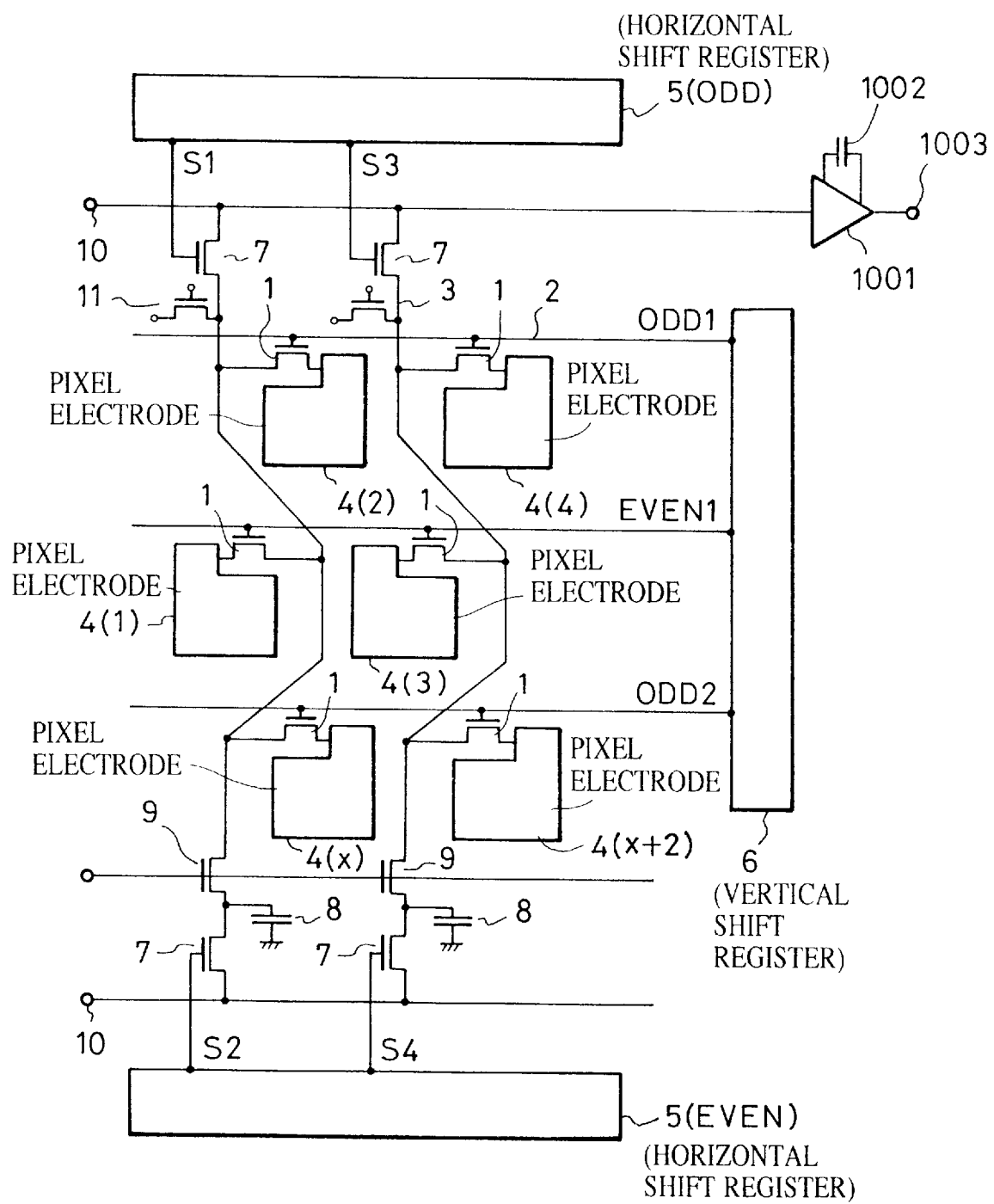
FIG. 16 is a circuit diagram of a liquid crystal display device containing a monitor circuit.
Figure 17:
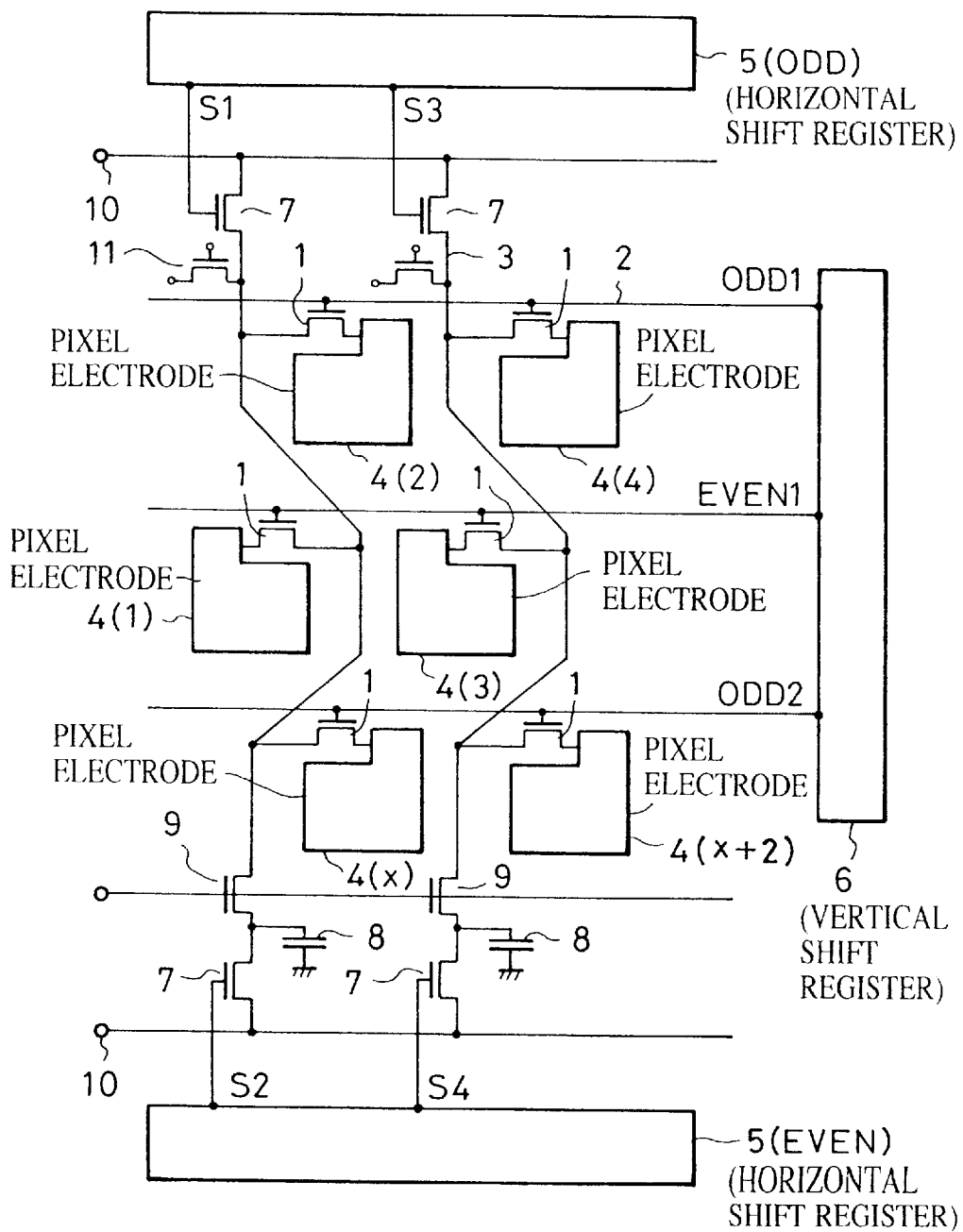
FIG. 17 shows an equivalent circuit of a liquid crystal display device.
Figure 18:
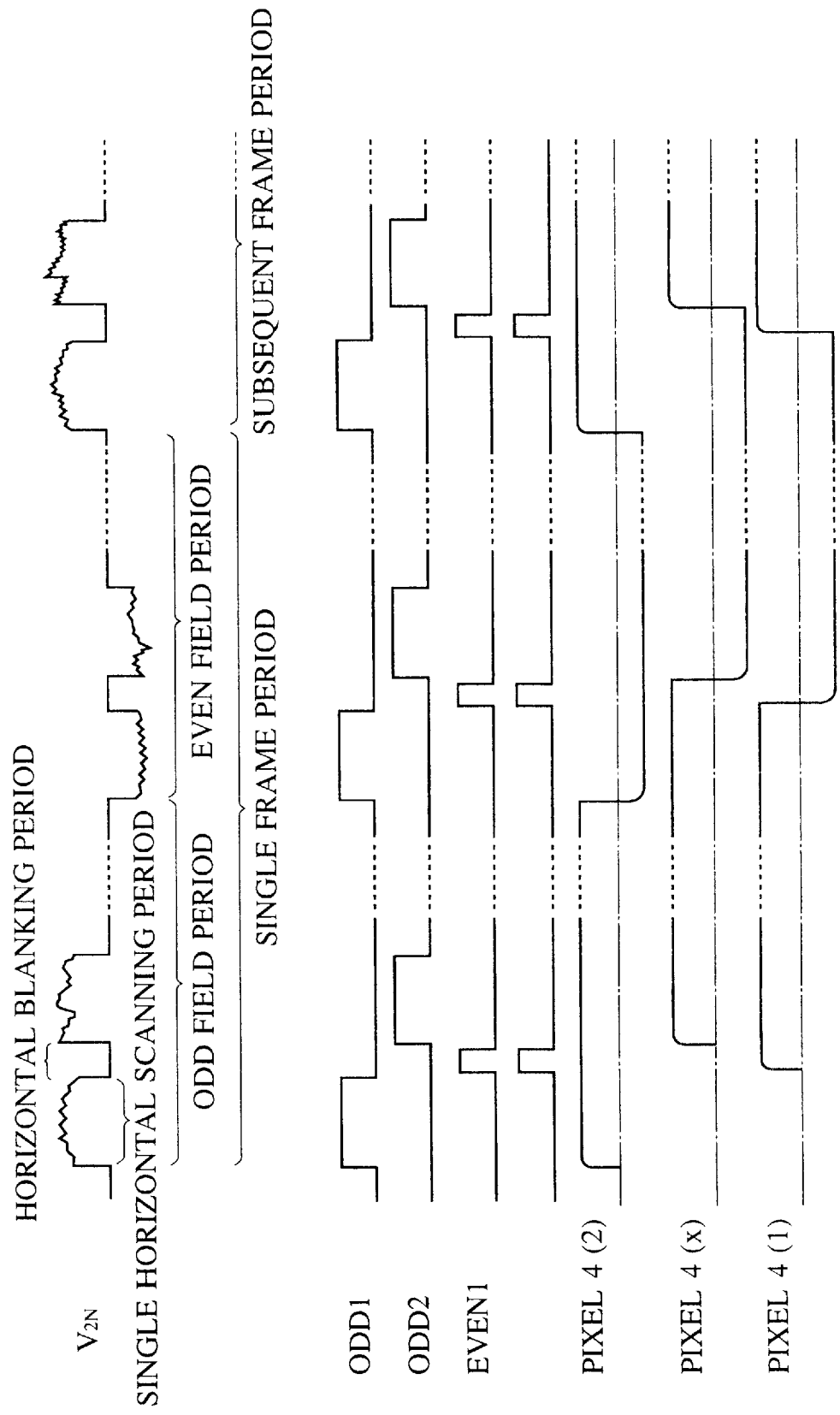
FIG. 18 shows driving pulse timings of the liquid crystal display device.
Figure 19A:
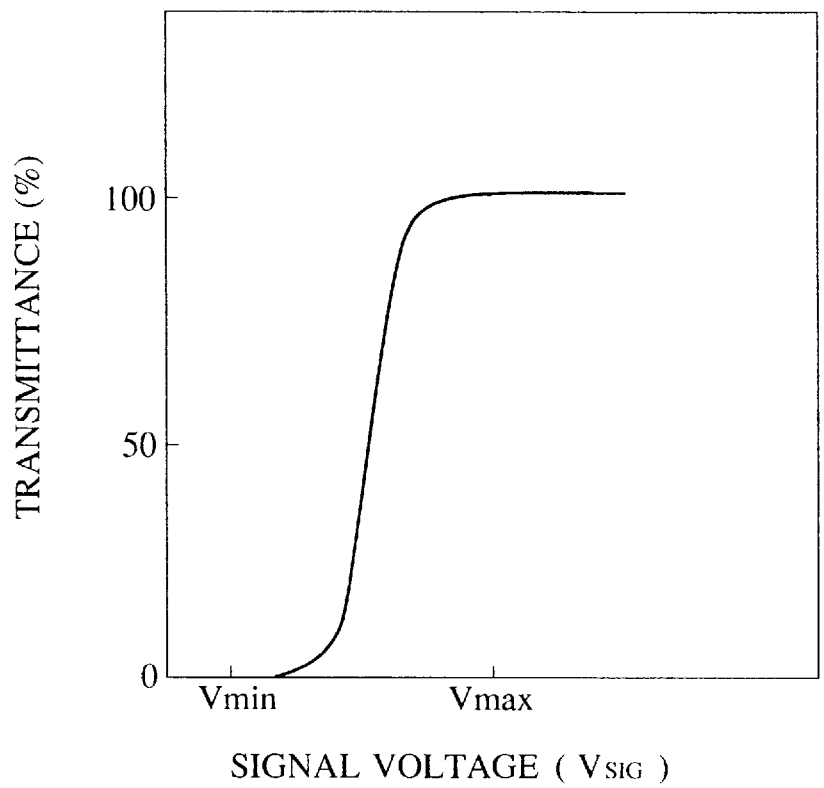
FIG. 19(a) is a graphic representation showing changes in the transmittance of the liquid crystal display device.
Figure 19B:
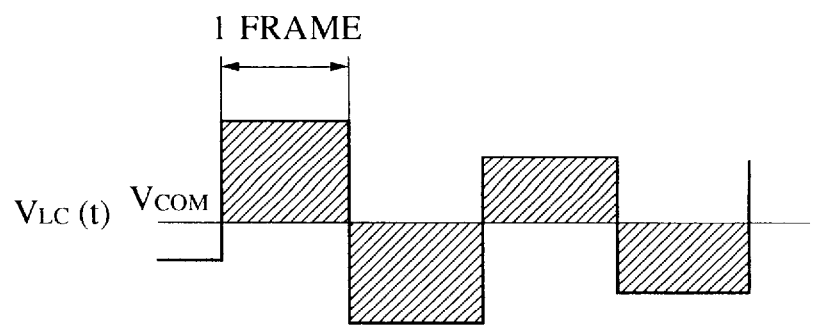
FIG. 19(b) illustrates the operation of the liquid crystal display device.

FIG. 16 shows a circuit of a liquid crystal display device including a monitor circuit. In FIG. 16, reference numeral 1001 denotes a monitor amplifier which may be an operational amplifier (operational amplifier circuit). Reference numeral 1002 denotes a phase compensation capacitor of the operational amplifier. Reference numeral 1003 denotes a monitor output terminal.

By providing a monitor in the liquid crystal display device, whether a desired signal is written in each portion can be electrically verified. This monitor is highly reliable. Further, the phase compensation capacitor of the monitor amplifier can be readily formed.

While the present embodiment is shown in FIG. 16 wherein the monitor amplifier is connected to the signal input terminal 10, alternate embodiments might include a monitor circuit for the signal line, gate line, shift register or pixel.

What is claimed is:

1. A liquid crystal display device comprising:

a transparent substrate;

a monocrystalline semiconductor substrate having a first conductivity type and containing a peripheral driving circuit, said peripheral driving circuit comprising a capacitor; and a liquid crystal material sandwiched between said transparent substrate and said monocrystalline semiconductor substrate, wherein said capacitor comprises a semiconductor diffused layer which is formed in a portion of said monocrystalline semiconductor substrate and has a second conductivity type which is opposite to the first conductivity type, a first electrode provided on said semiconductor diffused layer via an insulator film, and a second electrode which is connected to said semiconductor diffused layer and provided for applying a bias to said semiconductor diffused layer.

2. The liquid crystal display device according to claim 1, wherein said peripheral driving circuit further comprises an operational amplifier and said capacitor serves as a phase compensation capacitor of said operational amplifier.

3. The liquid crystal display device according to claim 1, wherein said peripheral driving circuit further comprises a bootstrap type shift register and said capacitor serves as a bootstrap capacitor of said bootstrap type shift register.

4. The liquid crystal display device according to claim 1, wherein said capacitor serves as a holding capacitor for holding a video signal.

5. The liquid crystal display device according to either of claims 1 or 4, wherein said monocrystalline semiconductor substrate is a Si substrate.

6. The liquid crystal display device according to claim 1, further comprising an image display portion, wherein said monocrystalline semiconductor substrate has a shape such that a portion thereof located below the image display portion is cut off so that said liquid crystal display device constitutes a transparent type liquid crystal display device.

7. The liquid crystal display device according to claim 1, wherein said monocrystalline semiconductor substrate has a reflecting plate so that said liquid crystal display device constitutes a reflection type liquid crystal display device.

8. The liquid crystal display device according to claim 1, wherein said monocrystalline semiconductor substrate has data signal lines and scanning signal lines formed therein while a switching element is disposed at each of intersections between said data signal lines and said scanning signal lines to so that said liquid crystal display device constitutes an active matrix liquid crystal display device.

9. The liquid crystal display device according to claim 8, wherein said switching element comprises a thin-film transistor.

10. The liquid crystal display device according to claim 9, wherein said thin-film transistor comprises a polycrystalline Si.

* * * * *